(12) United States Patent
Takimoto et al.

(10) Patent No.: US 7,806,985 B2
(45) Date of Patent: Oct. 5, 2010

(54) VACUUM DEVICE WHERE POWER SUPPLY MECHANISM IS MOUNTED AND POWER SUPPLY METHOD

(75) Inventors: Masayuki Takimoto, Sagamihara (JP); Hiroyuki Komuro, Sagamihara (JP); Yutaka Fuse, Sagamihara (JP); Tatsumi Abe, Sagamihara (JP); Kazuhito Aonahata, Sagamihara (JP)

(73) Assignee: Showa Shinku Co., Ltd., Sagamihara, Kanagawa (JP)

( * ) Notice: Subject to any disclaimer, the term of this patent is extended or adjusted under 35 U.S.C. 154(b) by 946 days.

(21) Appl. No.: 11/578,056

(22) PCT Filed: Jan. 24, 2005

(86) PCT No.: PCT/JP2005/000852

§ 371 (c)(1), (2), (4) Date: Oct. 12, 2006

(87) PCT Pub. No.: WO2006/006263

PCT Pub. Date: Jan. 19, 2006

(65) Prior Publication Data

US 2007/0215047 A1 Sep. 20, 2007

(30) Foreign Application Priority Data

Jul. 12, 2004 (JP) .............................. 2004-204457

(51) Int. Cl.
- *C23C 16/00* (2006.01)
- *C23F 1/00* (2006.01)
- *H01L 21/306* (2006.01)

(52) U.S. Cl. .................. 118/726; 118/730; 156/345.43; 156/345.44; 156/345.45; 156/345.46; 156/345.47; 156/345.54; 156/345.55

(58) Field of Classification Search ................. 118/723, 118/726, 730; 156/345.55; 439/9–11, 18, 439/19, 23, 24
See application file for complete search history.

(56) References Cited

U.S. PATENT DOCUMENTS

2003/0104142 A1* 6/2003 Murakami et al. .......... 427/598

FOREIGN PATENT DOCUMENTS

| JP | 54-158643 | 12/1979 |
|---|---|---|
| JP | 59-206174 | 11/1984 |
| JP | 2001/073136 | 3/2001 |
| JP | 2004-053681 | 2/2004 |

OTHER PUBLICATIONS

International Search Report (Application No. PCT/JP2005/000852) Dated May 17, 2005.
International Preliminary Examtnation Report dated Jan. 25, 2007 for Application No. PCT/JP2005/000852.

* cited by examiner

*Primary Examiner*—Parviz Hassanzadeh
*Assistant Examiner*—Rakesh Dhingra
(74) *Attorney, Agent, or Firm*—Eric J. Robinson; Robinson Intellectual Property Law Office, P.C.

(57) ABSTRACT

An improvement has been made in contact states between a rotating electrode arranged inside a vacuum chamber and a power supply mechanism which touches the rotating electrode to supply electric power thereto. A vacuum device is provided with a vacuum chamber, a rotating electrode arranged inside and electrically insulated from the vacuum chamber, and a power supply mechanism which touches the rotating electrode to supply electric power thereto, wherein the rotating electrode has an annular shape and horizontally rotates with respect to the center axis of the annular shape, and the power supply mechanism is composed of electrode members, and the electrode member and the rotating electrode come into contact with each other at at least one contact surface.

7 Claims, 7 Drawing Sheets

VACUUM DEVICE WHERE POWER SUPPLY MECHANISM IS MOUNTED AND POWER SUPPLY METHOD

TECHNICAL FIELD

The present invention relates to a power supply mechanism of a device for supplying electric power to a rotating body inside a vacuum chamber, and in particular, to the power supply mechanism of the device for supplying radio frequency power to a substrate dome on which a deposition substrate is mounted, the substrate dome being rotatably arranged.

BACKGROUND ART

In a vacuum deposition method, a method in which gas introduced in a vacuum chamber is ionized to generate a cation whereby evaporated molecules are pressed against a substrate, thereby forming a thin film which is strong in coherence and dense is generally referred to as Ion Assist Deposition (hereinafter abbreviated as "IAD").

Figure 4:
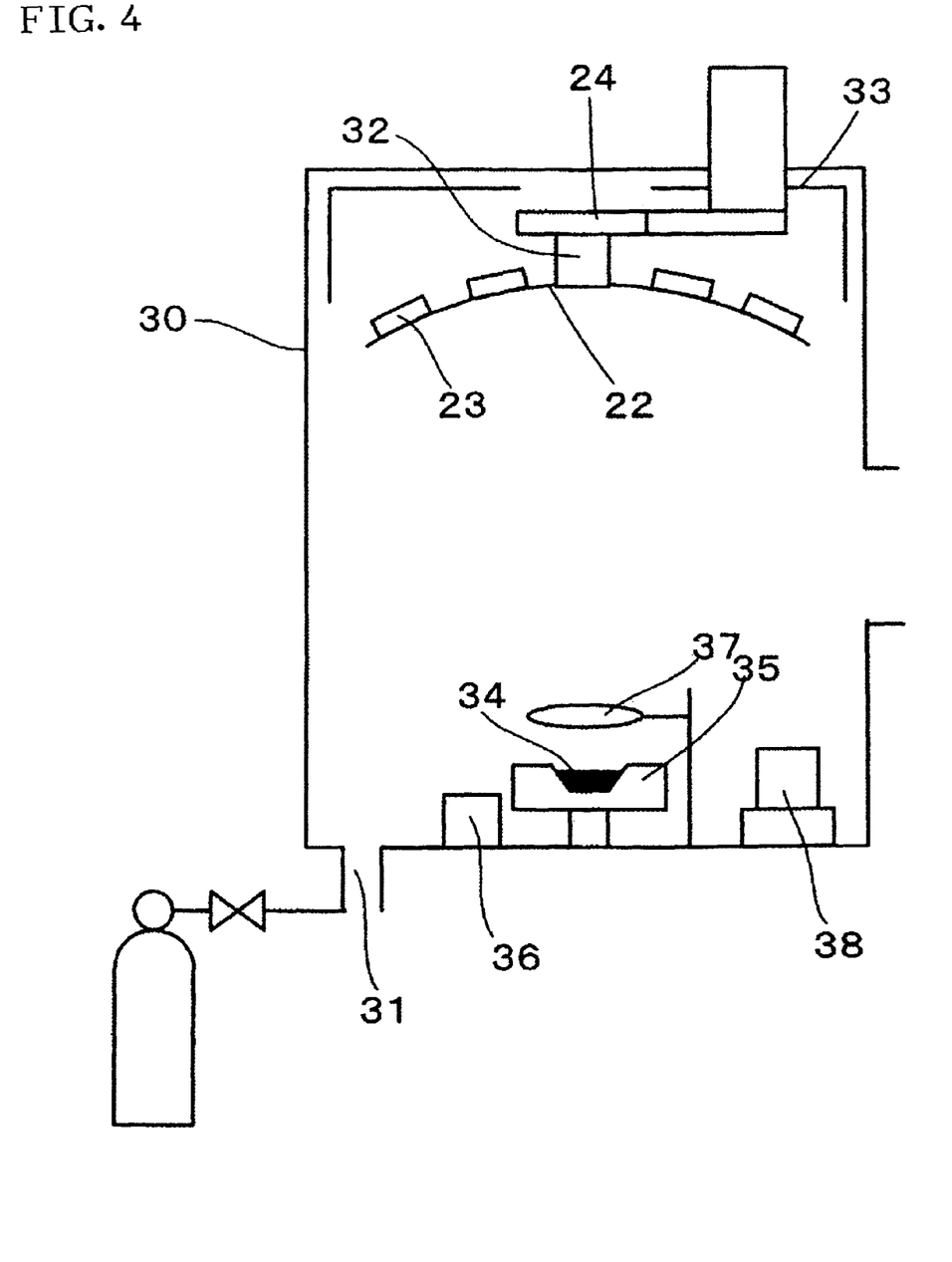
FIG. 4 shows a schematic diagram of a vacuum device.

FIG. 4 shows a schematic diagram of an optical thin-film vacuum-deposition device based on a radio-frequency voltage direct application system using the IAD method. The following outlines the formation of thin film using the system shown in the same figure.

In the vacuum chamber 30 are arranged a deposition substrate 23, substrate dome 22 on which the deposition substrate 23 is mounted, substrate dome rotation mechanism 24, substrate heater 33 for heating the deposition substrate 23, deposition material 34, crucible 35 filled with the deposition material, electron gun 36 for heating the deposition material 34 to evaporating temperature, shutter 37 for closing when deposition is completed to shield the deposition material, gas inlet 31 for introducing gas into the vacuum chamber, power supply mechanism 32 for applying radio frequency voltage across the substrate dome 22 being rotating and neutralizer 38 for emitting electrons.

When deposition is performed with the device shown in the same figure, the deposition substrate 23 is first attached to the substrate dome 22 and the crucible 35 is filled with the deposition material 34. Air is evacuated from the vacuum chamber 30 with an exhaust system (not shown), thereafter, the substrate dome 22 is rotated by the substrate dome rotation mechanism 24 and the deposition substrate 23 is heated under the substrate heater 33. At a time when degree of vacuum and temperature of the substrate reach target values, the deposition material 34 is irradiated with electron beams from the electron gun 36 to raise the temperature thereof to evaporating temperature. At the same time, gas is let in the vacuum chamber through the gas inlet 31 and electrons are emitted from the neutralizer 38. Radio frequency voltage is applied across the substrate dome 22 using the power supply mechanism 32 to ionize gas introduced from the gas inlet 31, thereby generating plasma in the vacuum chamber 30. The open of the shutter 37 causes the deposition material 34 to spatter inside the vacuum chamber and to be deposited on the deposition substrate 23 with an assist from ions, thereby forming a dense thin film. At a time when the thickness of film reaches a target value, the shutter 37 is closed, then the electron gun 36, substrate heater 33, power supply mechanism 32, introduction of gas, and neutralizer 38 are stopped. After cooling down, air is introduced into the vacuum chamber and then the deposition substrate 23 on which the thin film is formed may be taken out.

The aforementioned vacuum deposition device is disclosed in, for example, Patent Document 1.

Figure 5A:
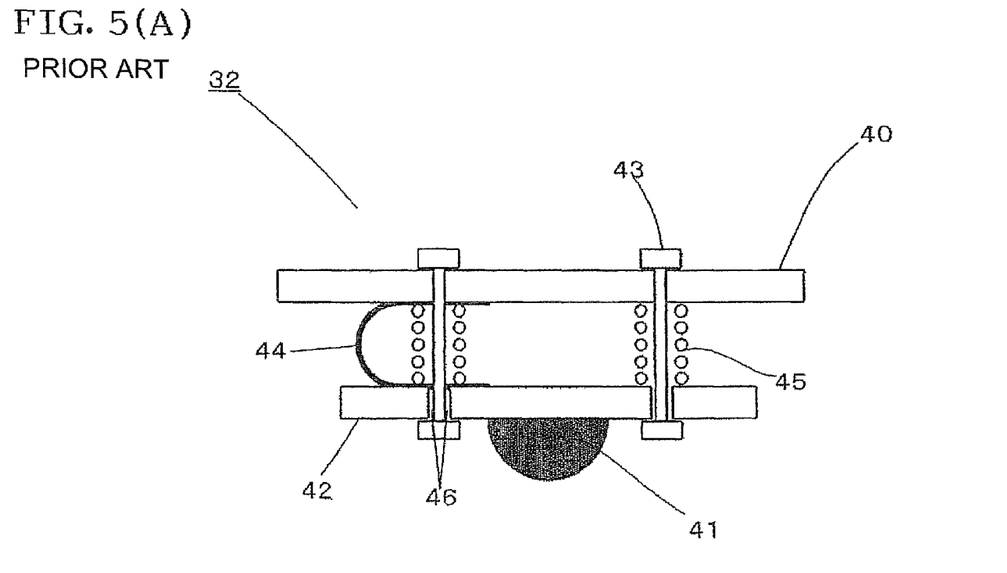
FIG. 5(A) shows a cross section view at line Z-Z' of a conventional power supply mechanism.
Figure 5B:
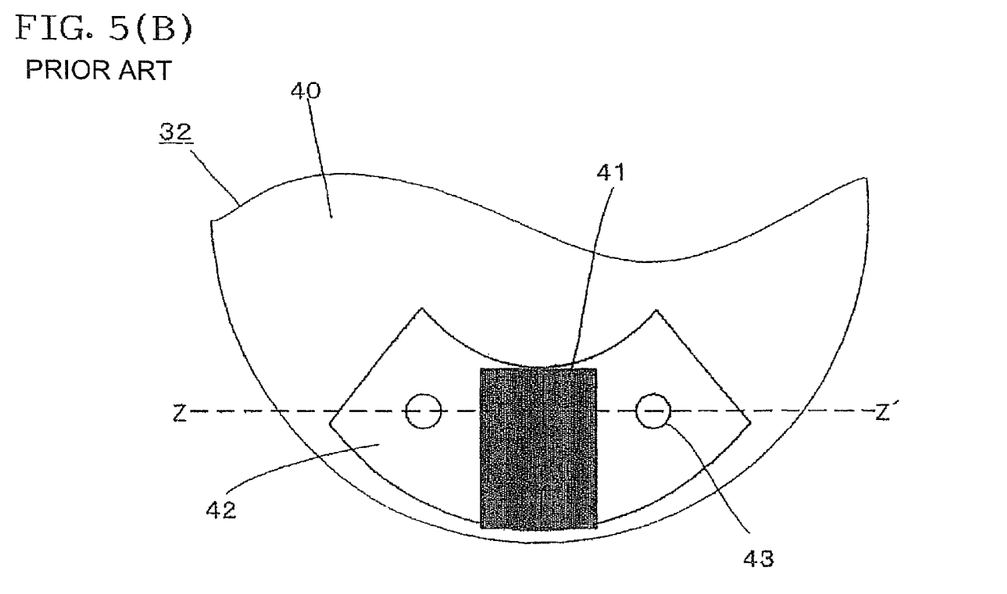
FIG. 5(B) shows a plane view of a conventional power supply mechanism.
Figure 6:
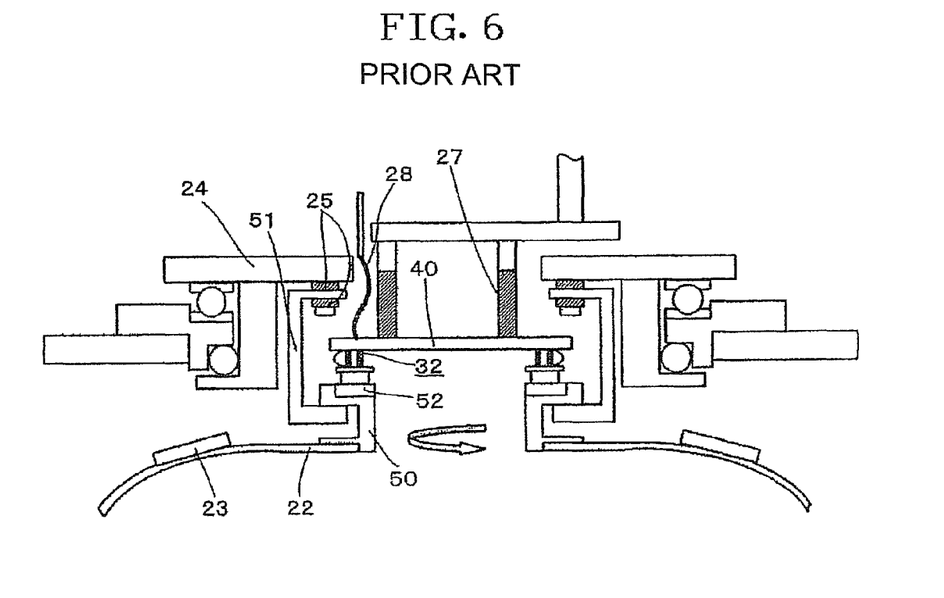
FIG. 6 shows a schematic diagram of a conventional power supply mechanism and peripheral mechanisms thereof.

FIG. 5(B) shows a schematic plan view of the power supply mechanism 32 illustrated in FIG. 4. FIG. 5(A) shows a schematic cross section taken along line Z-Z' in FIG. 5(B). The plan view shown in FIG. 5(B) illustrates the power supply mechanism 32 arranged in the vacuum chamber when viewed from the bottom plate to the top one. FIG. 6 shows a detailed schematic diagram of the power supply mechanism 32 and peripherals thereof. In the following a conventional power supply mechanism 32 is described with reference to FIGS. 5 and 6.

The power supply mechanism 32 is composed of a disk-shaped base 40 to which radio frequency power is supplied through a copper plate 28 from a radio-frequency power supply (not shown) installed outside the vacuum chamber 30, the base being electrically insulated from the vacuum chamber 30, contact 41 being an electrode for contacting a rotating body to supply electric power thereto, contact base 42 for fixing and arranging the contact 41, two pins 43 fixed to and arranged on the base and for holding the contact base, power supply thin plate 44 which assists in supplying radio frequency power from the base 40 to the contact base 42 and two springs 45 arranged between the base 40 and contact base 42. The contact 41, contact base 42, pins 43, springs 45 and power supply thin plate 44 form one contact unit. A plurality of the contact units are arranged on the base 40. For example, four contact units are mounted on one device whose substrate dome is about ϕ700 to 1200 in diameter.

Figure 8:
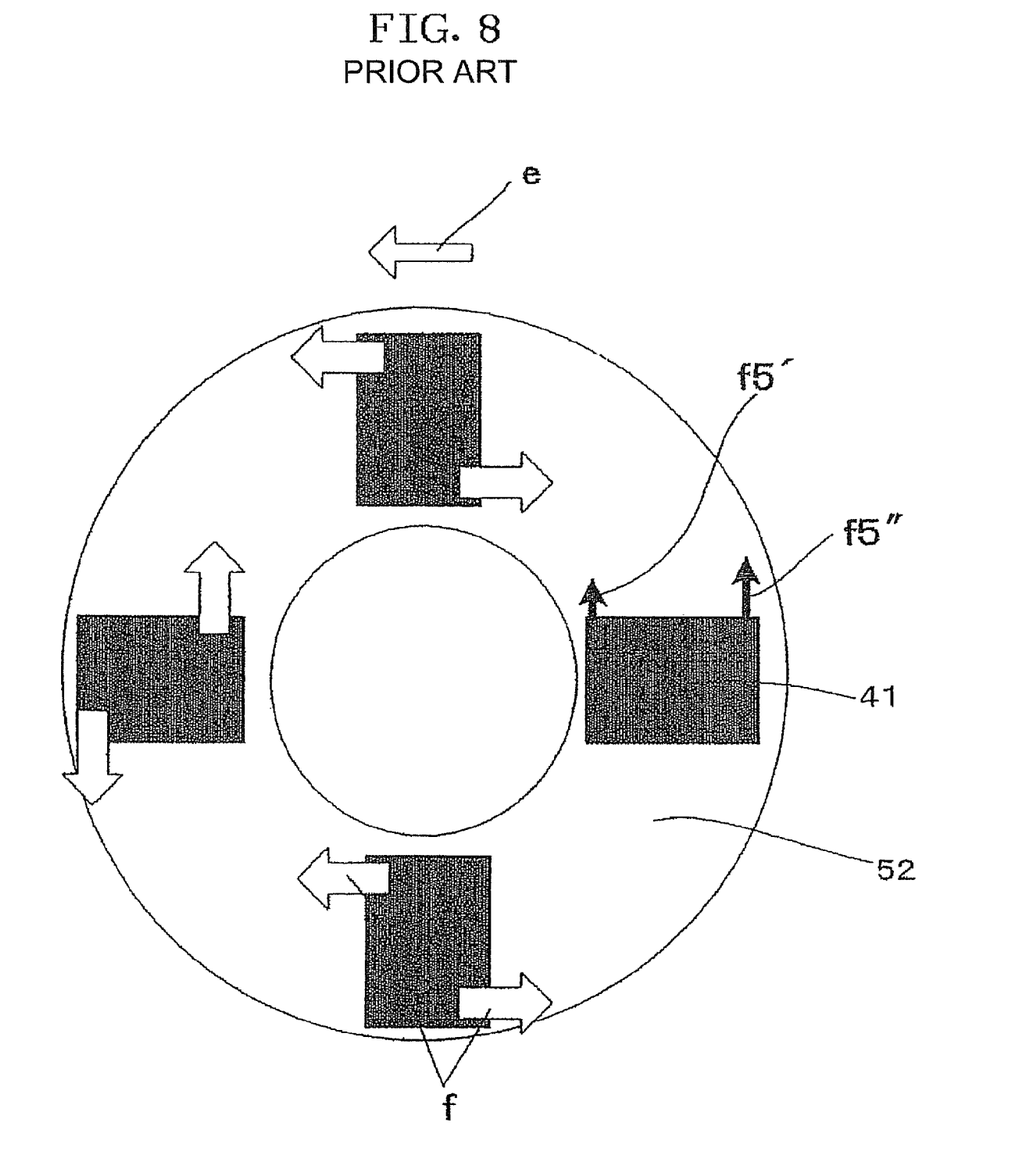
FIG. 8 shows a schematic plan view of the conventional power supply mechanism.

A rotating body composed of the substrate dome 22, a dome catcher 51, a dome adapter 50 and a power supply plate 52 is electrically insulated from and rotatably arranged inside the vacuum chamber 30 and integrally rotated. The power supply plate 52 is fixed and arranged on the dome adapter 50 and the power supply mechanism 32 is arranged over the power supply plate 52. FIG. 8 schematically shows states of the contact 41 touching the power supply plate 52. The figure shows the power supply plate 52 when viewed from the top plate to the bottom one in the vacuum chamber. Four contact units are arranged and only contact 41 is shown. The power supply plate 52 is disc-shaped and has a concentric-circle hole at the center thereof. The contact 41 of each unit is attached in such a manner that the longitudinal direction thereof is arranged radially from the center of rotation of the power supply plate 52.

The power supply mechanism 32 is arranged on the top plate of the vacuum chamber through a porcelain insulator 27 and is electrically insulated from the vacuum chamber. The contact 41 as an electrode touches the power supply plate 52 to apply radio frequency voltage across the rotating body. Since the rotating body is arranged in the vacuum chamber using an insulator or the like, electric power is supplied to only the rotating body contacting the power supply mechanism. Thus, the application of radio frequency voltage across the substrate dome 22 being the rotating body allows deposition using the IAD method.

The two pins 43 are inserted into two through holes 46 provided in the contact base 42. The contact base 42 and the contact 41 fixed thereto are movably held along the pins 43. The spring 45 is arranged around the periphery of the pin 43 and the elastic force of the spring 45 provides the contact 41 with a force thrusting the power supply plate 52 through the contact base 42. The cross section of the contact 41 is arc, and the arc curved-surface thereof touches the power supply plate 52. The contact 41 is made of materials such as phosphor bronze and copper.

Fixing the contact 41 to the base 40 may destabilize the contact between the contact 41 and the power supply plate 52 when the contact has been worn with rotation, which fails to stably supply radio frequency power to the substrate dome 22, causing discharge failures. The substrate dome 22 is removed each time deposition is completed, so that a slight error is produced in distance between the power supply plate 52 and the base 40 each time the substrate dome 22 is fixed. For this reason, in the conventional power supply mechanism, the pin 43 has been provided perpendicularly to the plane of the power supply plate 52 to hold the contact base 42 movably along the pin 43, thereby allowing the contact 41 to be thrust perpendicularly to the plane of the power supply plate 52.

Patent Document 1: Japanese Patent Application Laid-Open No. 2001-73136

There has been a problem in that the conventional contact is a small in area where it touches the rotating body and comes into linear contact with the power supply plate, which hastens the wear of the contact. This is because the conventional power supply plate has been subjected to tufftride process to harden the surface thereof, increasing the slip resistance of the power supply plate. The wear of the contact comes out of contact with the power supply plate, causing a problem in that arc discharge is generated to significantly scrape off the tip of the contact part. In addition to the above, there has been another problem in that the tufftride process is liable to increase electrical resistance. A high slip resistance roughens the power supply plate due to wear, increasing electrical resistance by use to lower the power supply efficiency.

The conventional contact comes into linear contact with the rotating body in terms of shape, so that the contact area inevitably becomes small and impedance is increased. Furthermore, there is still another problem in that the wear of the contact part varies the contact area, leading to change in impedance between a new and a worn contact.

Figure 7:
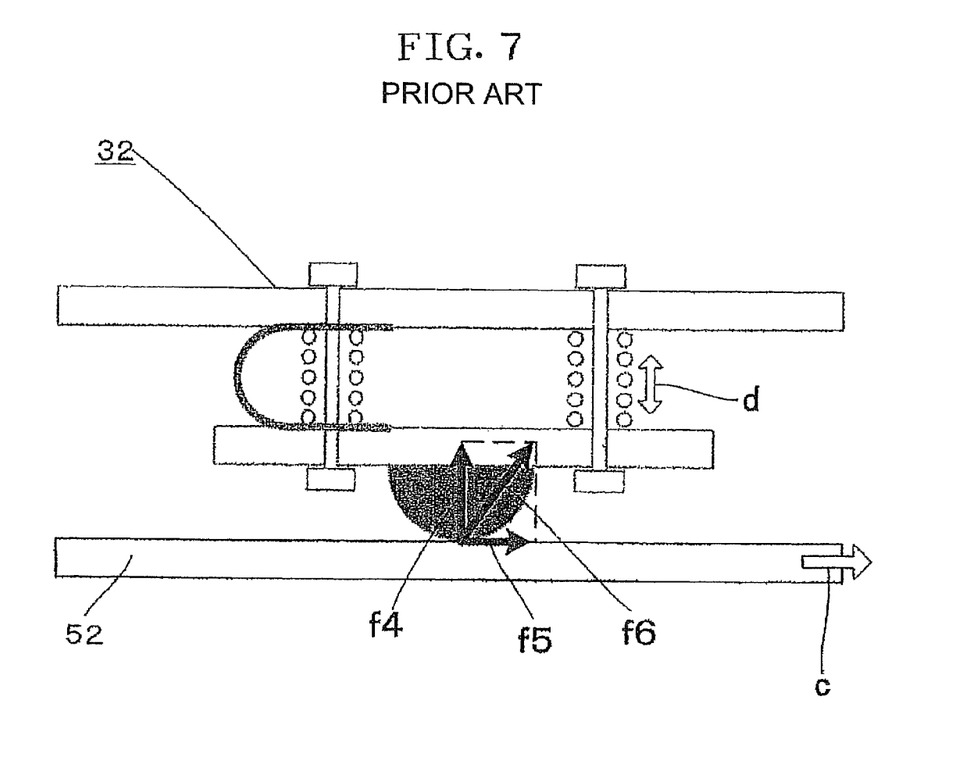
FIG. 7 show a schematic diagram of the conventional power supply mechanism.

Furthermore, the conventional contact unit reciprocates along the two pins arranged perpendicularly with respect to the power supply plate being a rotating body, this results in an operational failure. An external force applied to the contact in the conventional mechanism is described with reference to the FIG. 7. The contact 41 is subjected to its own weight and a force f4 equal to a force applied from the contact 41 to the power supply plate 52 by the elastic force of the spring. In addition, the contact 41 is subjected to a force f5 in the rotational direction (i.e., the direction shown by an arrow "c" in the figure) from the power supply plate 52 by the rotation of the substrate dome 22. The contact 41 is subjected to the resultant force f6 composed of the sum of the forces f4 and f5, however, in the conventional mechanism, the resultant force f6 applied to the contact 41 is not coincident in direction with the move of the contact 41 (i.e., the direction of the arrow "d" shown in the figure), this results in an operational failure. In the conventional mechanism, the contact 41 is arranged in such a manner that the longitudinal direction thereof is radially arranged with respect to the center of rotation, so that the force f5 in the direction of rotation is different depending on a position where the contact 41 touches the power supply plate 52. FIG. 8 schematically shows the direction and magnitude of a force applied to each point of the conventional contact 41. Since the force f5 in the direction of rotation (i.e., the direction of the arrow "e" shown in the figure) is proportional to velocity, the magnitude of force varies from the center where velocity is lower (f5') and to the outer periphery where velocity is higher (f5"), this produces torsion in the contact (shown by the arrow "f" in the figure).

In addition, the small spring is sensitive to heat to tend to lose elasticity, impeding a smooth vertical motion.

DISCLOSURE OF THE INVENTION

According to a first aspect of the present invention, there is provided a vacuum device characterized by comprising a vacuum chamber, a rotating electrode arranged inside and electrically insulated from the vacuum chamber and a power supply mechanism which touches the rotating electrode to supply electric power thereto, wherein the rotating electrode has an annular shape and horizontally rotates with respect to the center axis of the annular shape, and the power supply mechanism is composed of electrode members, and the electrode member and the rotating electrode come into contact with each other at least one contact surface. Furthermore, the electrode member has such a shape that a cross-section area taken in a plane equal in distance from the contact surface is constant.

According to a second aspect of the present invention, there is provided a vacuum device characterized by comprising a vacuum chamber, a rotating electrode arranged inside and electrically insulated from the vacuum chamber, and a power supply mechanism which supplies electric power through a contact portion on the rotating electrode, wherein the rotating electrode has an annular shape and horizontally rotates with respect to the center axis of the annular shape, and the power supply mechanism is composed of electrode members, and the electrode member is movable to the direction substantially coinciding with the direction of force applied by the rotating electrode.

According to a third aspect of the present invention, there is provided a vacuum device characterized by comprising a vacuum chamber, a rotating electrode arranged inside and electrically insulated from the vacuum chamber, and a power supply mechanism which touches the rotating electrode to supply electric power thereto, wherein the rotating electrode has a cylindrical shape and horizontally rotates with respect to the center axis of the cylindrical shape and the power supply mechanism is composed of electrode members, and the electrode member and the rotating electrode come into contact with each other at least one contact portion, and the contact portion is located on at least the side of the rotating electrode. Furthermore, the electrode member is movable to the direction interposed between two directions, the one direction where the electrode member is positioned, the direction being normal to the contact portion, and the other direction to which the rotating electrode rotates, the direction being tangential t6 the contact portion, and to the direction symmetrical to the direction interposed.

In the second and the third aspect of the present invention, the electrode member is supported by one fulcrum, the fulcrum is positioned on any point on a straight line virtually perpendicular to the direction of the force or the resultant force and passing through one point on the electrode member, and the electrode member is movable around the fulcrum.

In the first to the third aspect of the present invention, the power supply mechanism is further provided with an electrode base which fixes the electrode member, a unit base which supports the electrode member base, and a pin which fastens the electrode member base to the unit base, and the electrode member base and the electrode are movable using the pin as a fulcrum. Further, the contact portion or contact surface is located in the inner side of the rotating electrode. Still further, the vacuum device has at least one spring which presses the electrode member against the rotating electrode. The rotating electrode consists of a rotating cylinder with a substrate dome on which a deposition substrate is mounted and the contact portion or contact surface. Still further, the power supply mechanism is further provided with a spring base which fixes the spring to the unit base, a power supply thin plate which supplies electric power from the base to the electrode, a countersunk screw which fastens the electrode to the electrode base with the power supply thin plate sandwiched therebetween, and a power-supply thin plate retainer which fixes the power supply thin plate to the spring base.

According to a fourth aspect of the present invention, there is provided a method of supplying electric power in a power supply mechanism consisting of an electrode member which supplies electric power to an annular rotating electrode arranged inside and electrically insulated from a vacuum chamber, the method characterized by comprising horizontally rotating the rotating electrode with respect to the center axis of the annular shape, causing the electrode member and the rotating electrode to come into face contact with each other at least one of the contact surface, and maintaining the area of the contact surface constant.

According to a fifth aspect of the present invention, there is provided a method of supplying electric power in a power supply mechanism consisting of an electrode member which supplies electric power to an annular rotating electrode arranged inside and electrically insulated from a vacuum chamber, the method characterized by comprising horizontally rotating the rotating electrode with respect to the center axis of the annular shape, causing the electrode member and the rotating electrode to come into face contact with each other at least one of the contact surface, and arranging the electrode member movable to the direction substantially coinciding with the direction of force applied by the rotating electrode.

In the above fourth or fifth aspect, the rotating electrode is composed of a power supply body which is electrically connected to a substrate dome on which a deposition substrate is mounted and the power supply mechanism.

The present invention has enabled supplying stable electric power to the rotating body and provided the power supply mechanism excellent in maintainability.

DESCRIPTION OF SYMBOLS

1 Power supply mechanism
2 Contact
3 Contact base
4 Spring base
5 Spring
6 Power supply thin plate
7 Pin
8 Countersunk screw
9 Unit base
10 Power supply thin-plate retainer
11 Stopper part
12 Fixing hole
13 Through hole
20 Power supply ring
21 dome adapter
22 Substrate dome
23 Deposition substrate
24 Rotation mechanism
25 Porcelain insulator
26 Base
27 Porcelain insulator
28 Copper plate
30 Vacuum chamber
31 Gas inlet
32 Power supply mechanism
33 Substrate heater
34 Deposition material
35 Crucible
36 Electron gun
37 Shutter
38 Neutralizer
40 Base
41 Contact
42 Contact base
43 Pin
44 Power supply thin plate
45 Spring
46 Through hole
50 dome adapter
51 dome catcher
52 Power supply plate

BEST MODE FOR CARRYING OUT THE INVENTION

Figure 1A:
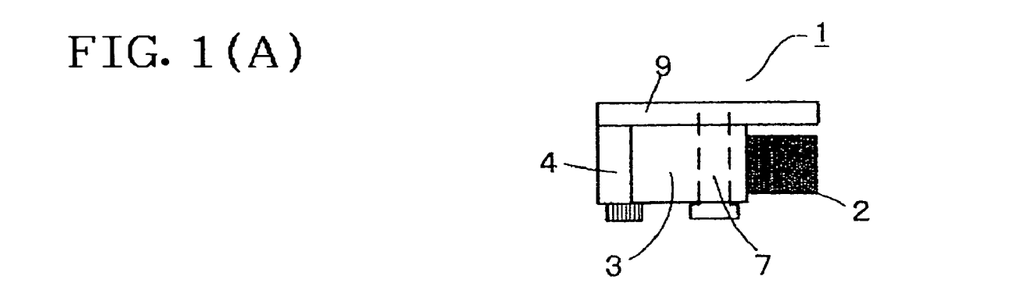
FIG. 1(A) shows a side view of a power supply mechanism according to the present invention.
Figure 1B:
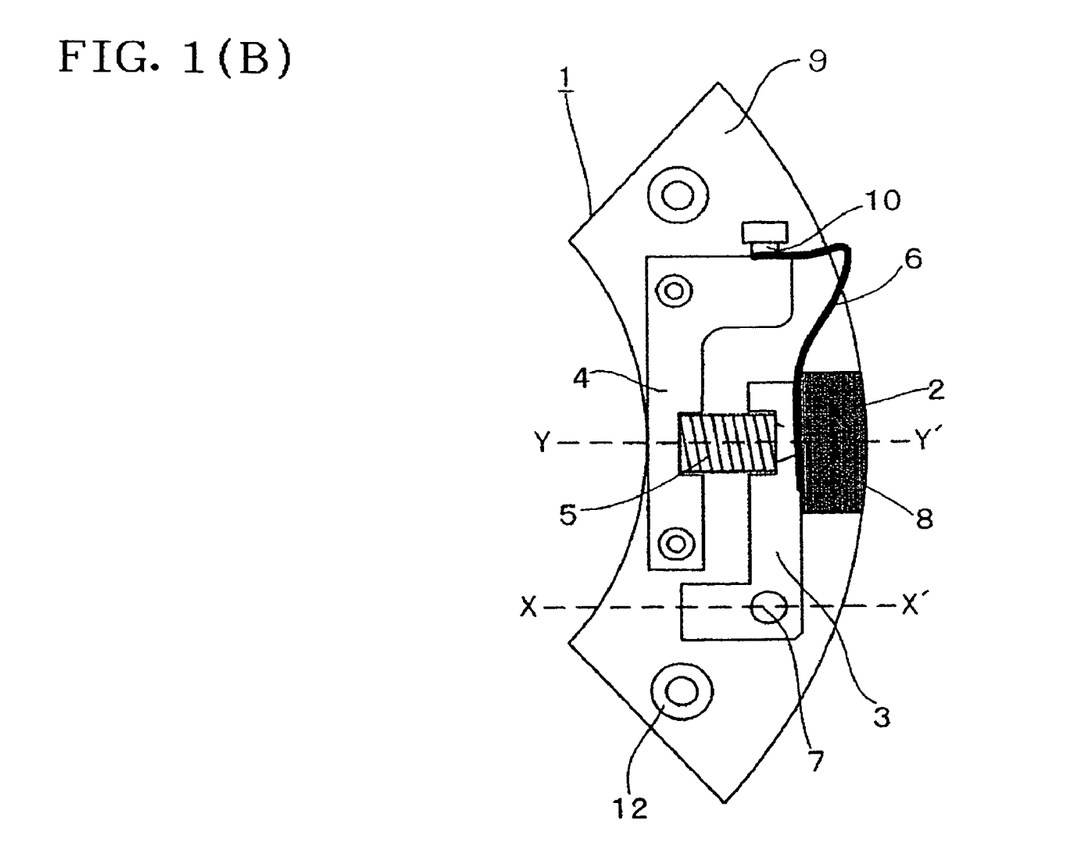
FIG. 1(B) shows a plan[e] view of a power supply mechanism according to the present invention.
Figure 1C:
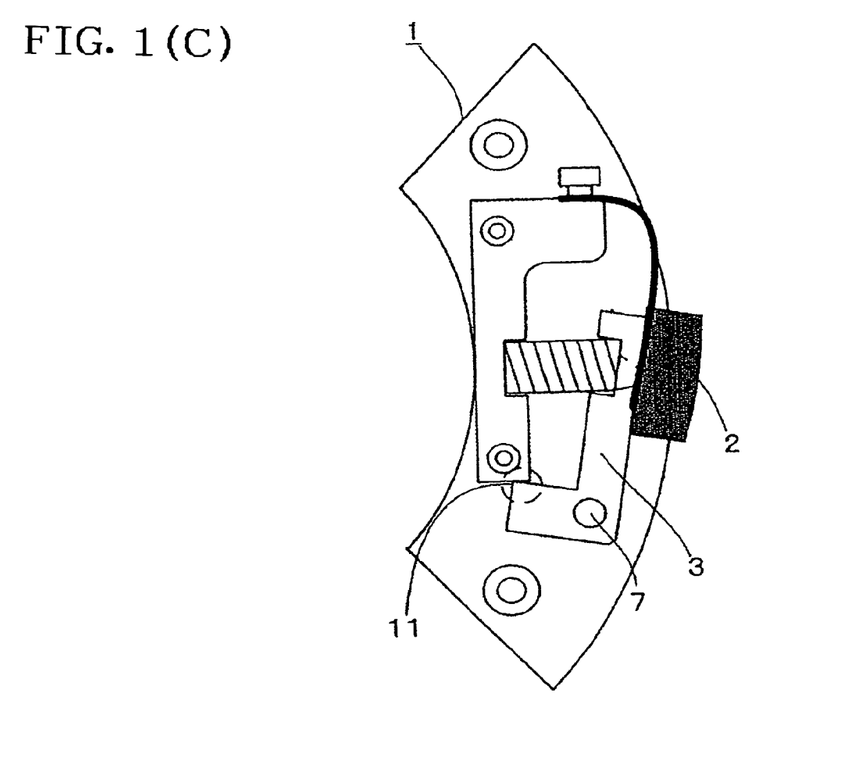
FIG. 1(C) shows a plan[e] view of a power supply mechanism according to the present invention.
Figure 1D:
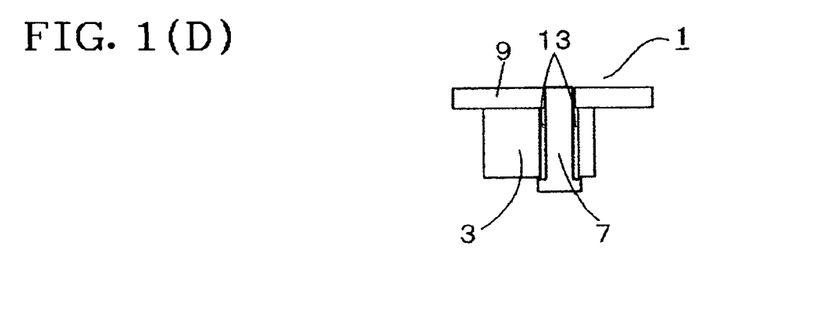
FIG. 1(D) shows a cross section view at line X-X' of a power supply mechanism according to the present invention.
Figure 1E:
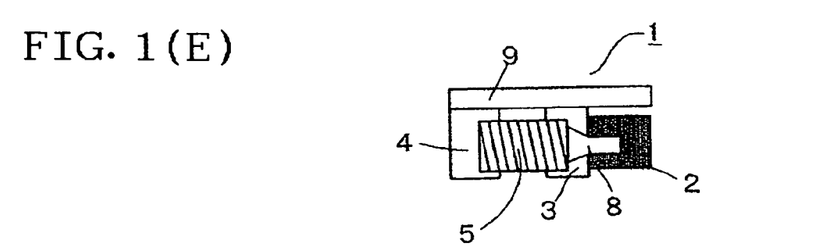
FIG. 1(E) shows a cross section view at line Y-Y' of a power supply mechanism according to the present invention.
Figure 2:
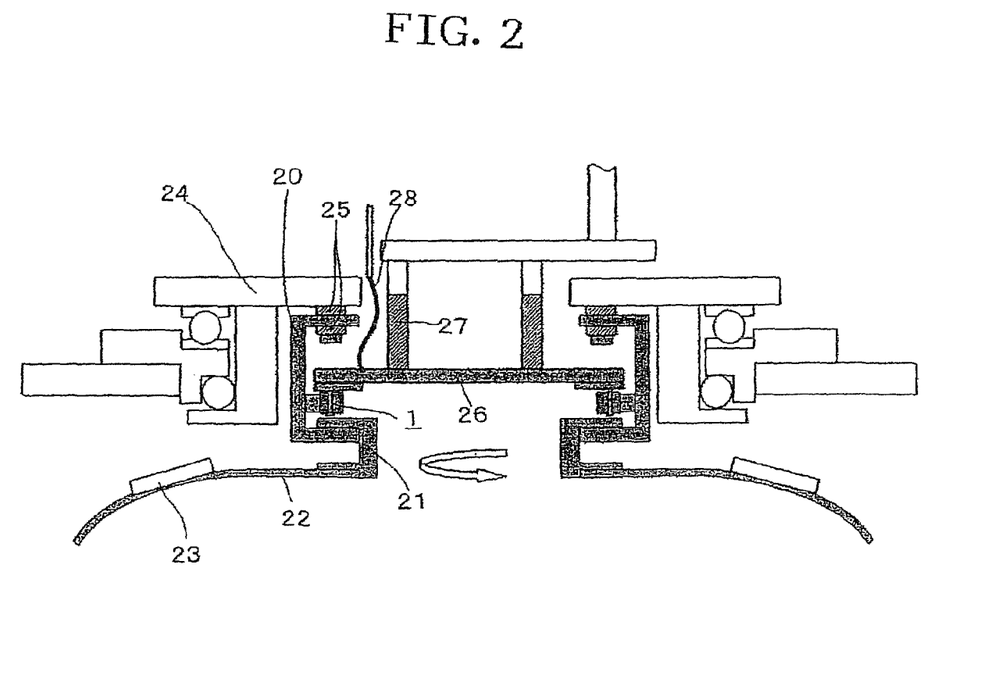
FIG. 2 shows a schematic diagram of the power supply mechanism and peripheral mechanisms thereof according to the present invention.

The embodiment of the power supply mechanism related to the present invention is described with reference to FIGS. 1 and 2. The same parts as in the conventional art are given the same reference characters to omit duplicated descriptions thereof. FIG. 1 shows a schematic diagram of a power supply mechanism and FIG. 2 shows a schematic diagram of the power supply mechanism and peripheral mechanisms thereof. The mechanism illustrated in FIGS. 1 and 2 may be mounted on, for example, a vacuum device shown in FIG. 4.

The power supply mechanism 1 shown in FIG. 1 is composed of a unit base 9, contact 2 being an electrode touching a rotating body to supply electric power thereto, spring base 4 fixed to and arranged on the unit base 9 and has a recess, contact base 3 arranged on the unit base 9 and has a recess, pin 7 for fixing the contact base 3 to the unit base 9, spring 5 fitted into the recesses of the spring base 4 and contact base 3, power supply thin plate 6 for supplying electric power from unit base 9 to the contact 2, countersunk screw 8 for securing the contact 2 to the contact base 3 with one end of the power supply thin plate 6 clamped therebetween, and power supply thin-plate retainer 10 for securing the power supply thin plate 6 to the spring base 4 with the other end of the power supply thin plate 6 clamped between the retainer and the spring base. FIG. 1(A) shows a schematic side view. FIG. 1(B) shows a schematic plan view of the power supply mechanism 1 installed and arranged inside the vacuum chamber when viewed from the bottom plate to the top one. The power supply mechanism 1 illustrated in FIG. 1 shows one unit. Two contact units may be attached to, for example, a device whose substrate dome is φ700 to 1200 in diameter.

A power supply ring 20, dome adapter 21 and substrate dome 22 shown in FIG. 2 compose a rotating body and are arranged inside the vacuum chamber and electrically insulated therefrom. Specifically, the power supply ring 20 is fixed to a rotation mechanism 24 via a porcelain insulator 25, and the dome adapter 21 and substrate dome 22 are attached and fixed to the power supply ring 20 and dome adapter 21 respectively. In the present embodiment, the above composing elements may be fastened with screws so that the elements are integrally rotated because the rotating body is separably composed with consideration for maintainability. Electric power is supplied from the power supply mechanism 1 to the rotating body electrically insulted from the peripheral mechanisms. A deposition substrate 23 is mounted on the substrate dome 22 and radio frequency power is supplied from the power supply mechanism 1 to the substrate dome 22 to deposit dense thin film using the IAD method. This is the same as a conventional method.

The power supply mechanism 1 is attached to the base 26 and the base 26 is secured and arranged inside the vacuum chamber and electrically insulated therefrom. In the present embodiment, the unit base 9 is fixed through a fixing hole 12 to the lower part of the base 26 secured to and arranged on the top plate of the vacuum chamber via the porcelain insulator 27, thereby enabling each unit to be removed at the time of maintenance. Radio frequency power applied to the base 26 by the copper plate 28 connected to a radio frequency power supply (not shown) installed outside the vacuum chamber is supplied to the power supply ring 20 through the unit base 9, spring base 4, power supply thin plate 6 and contact 2, and then to the substrate dome 22 via the dome adapter 21. In FIG. 2, parts to which Radio Frequency (RF) is applied in the vacuum chamber are colored and the porcelain insulator is shaded. The elements composing the route where the above RF power is applied preferably use a high conductive material such as copper.

The contact of the contact 2 of the power supply mechanism 1 with the rotating power supply ring 20 supplies electric power from the power supply mechanism 1 to the rotating body. The power supply ring 20 is cylindrical and the contact 2 touches the inner wall surface of the cylinder. In the present embodiment, the power supply ring 20 uses a conventional dome catcher as power supply part, thereby reducing the number of components. The contact 2 is characterized in that it is so shaped as to come into face contact with the power supply ring 20, thereby increasing a contacting area to stabilize power supply. In the present embodiment, one face of a rectangular parallelepiped is taken as a curved surface which is equal in curvature to the curved surface of the power supply ring 20, and the curved surface is caused to touch the power supply ring 20, which allows a contacting area to be 13 times as wide as that of the conventional mechanism shown in FIG. 5 at the time of starting to use a new contact. This solves such a problem that the contacting area of the conventional contact which comes into line contact or of the contact formed by a sphere which comes into point contact is so small as to increase impedance or such a problem that the end of the contact is so small in volume that the contact is rapidly worn, thereby contributing to stable supply of electric power, improvement in stability of discharge, and reduction in burden to power supply.

The abovementioned shape of the contact 2 does not change in contacting area even if the surface thereof is worn, and use will not change impedance to enable electric power to be stably supplied. The shape of the contact 2 is not limited to that of the above embodiment, but it may be such a shape that faces being in the normal direction to and equal in distance from the contact surface of the rotating body are always equal in area.

Causing the contact 2 to touch the wall surface of the cylindrical power supply ring 20 will not produce torsion in the contact 2 unlike the conventional art, allowing operational failure to be reduced. This is because force in rotational direction applied to the contact 2 by the power supply ring 20 is equal in the contacting surface where the power supply ring 20 touches the contact 2. The contacting surface between the rotating body supplied with power and the contact 2 is not limited to the above embodiment, but it may be arranged on a circle concentric with the center axis of the rotating body.

The use of phosphor bronze as a material for the contact 2 allows the contact 2 to become high in heat resistance and to come into face contact with the power supply ring 20 because a protrusion thereof is scraped in a short time even though the shape of the contact 2 does not completely coincide with that of the power supply ring 20 at the time of starting to use a new contact. Furthermore, the use of a material made of stainless steel subjected to a surface treatment with Teflon® electroless nickel or electroless nickel enables electric conductivity to be maintained to higher level and slip resistance to be decreased. A vacuum nitriding treatment may be used to increase surface hardness. The use of a material made of stainless steel subjected to a surface treatment with Teflon® electroless nickel or electroless nickel for the power supply ring 20 also contributes to decreasing electrical resistance and slip resistance and improving heat resistance and thermal wear resistance. In the present embodiment, stainless steel subjected to vacuum nitriding treatment is used for the power supply ring 20 larger in size and expensive than the contact 2 to increase wear resistance and phosphor bronze is used for the contact 2 to make it a consumable.

The recess parts of the spring base 4 and contact base 3 may be basins having such a shape as to allow the spring 5 to be fitted thereinto, but are preferably equal in shape to the spring 5. The spring base 4 and contact base 3 are arranged at a position where the contact 2 touches the power supply ring 20 and where the recesses face each other. FIG. 1(E) shows a schematic cross section along line Y-Y' illustrated in FIG. 1(B). The spring base 4 is fastened to the unit base 9 with a screw or others and the contact base 3 is attached to the unit base 9 with the degree of freedom. Specifically, the through hole 13 is formed in the contact base 3 and the pin 7 is inserted therein to attach the contact base 3 to the unit base 9, thereby enabling the contact base 3 to be rotated using the pin 7 as fulcrum. FIG. 1(D) shows a schematic cross section along line X-X' illustrated in FIG. 1(B). It is advisable to bake molybdenum disulfide on the pin 7 or subject it to other surface treatment in order to reduce friction. The spring 5 is put in the recess with the spring shrunken and elasticized to press the contact 2 against the power supply ring 20.

Figure 3:
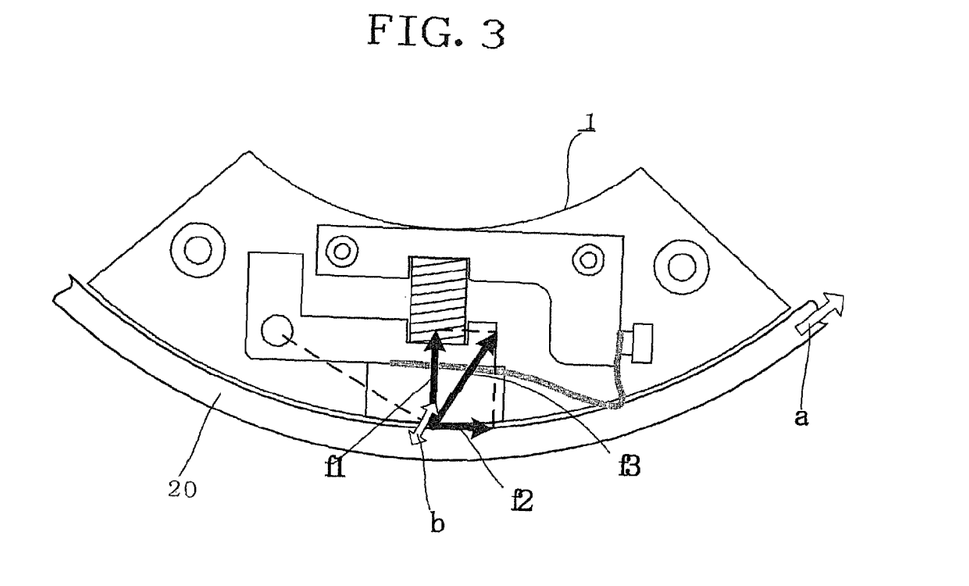
FIG. 3 is a drawing describing external forces applied to the power supply mechanism according to the present invention.

External force applied to the contact 2 is described with reference to FIG. 3.

Since the contact 2 is pressed against the power supply ring 20 by the spring 5, the contact 2 is subjected to force f1 by the power supply ring 20 in the direction in which the contact 2 is pushed back. On the other hand, when the substrate dome 22 starts to rotate, the contact 2 is subjected to force f2 in the rotational direction or in the direction shown by an arrow "a" in the figure by the power supply ring 20. This means that the contact 2 is subjected to the resultant force f3 composed of the sum of the forces f1 and f2. At this point, the movable direction or the direction shown by the arrow "b" in the figure of the contact 2 in the present embodiment is substantially coincide with the direction of the resultant force f3, which ensures stable operation with rotation at all times. Since the resultant force f3 applied to the contact 2 varies with rotational speed and elastic force of the spring 5, the resultant force f3 applied to the contact 2 is determined beforehand in line with a desired rotational speed and others to arrange the contact 2 to be movable in the direction equal to that of the resultant force f3. In the present embodiment, the contact 2 is composed to reciprocate on an arc using the pin 7 as fulcrum, so that the pin 7 may be located on a line passing the surface touching the power supply ring 20 and being perpendicular to the direction of the resultant force f3.

The movement of the contact base 3 on an arc using the pin 7 as fulcrum may cause the spring 5 inserted into the recesses to fly out unless the range of movement is properly restricted. In the present embodiment, the contact base 3 is made L-shaped and configured to move within a given angle at which one end of the L-shape collides with the spring base 4. The contact base 3 and spring base 4 may be properly shaped to move within a desired angle. For example, a pin may be separately provided as a stopping component for restricting the movement of the contact base 3 to the movement range. In the present embodiment, forming a stopping part 11 with the contact base 3 and spring base 4 contributes to a reduction in the number of components. FIG. 1(C) shows states that the contact is stopped by the stopping part.

In the present embodiment, the contact 2 moves in a different manner from the conventional one, which permits a material larger in diameter and in wire diameter to be used for the spring 5. This enables the suppression of a decrease in pressing force caused by shrinkage of the spring by heat. While pressing force is increased by the spring 5, wear is moderate because the contact 2 and the power supply ring 20 are subjected to surface treatment for decreasing slip resistance. This allows electric power to be supplied while the substrate dome 22 is being rotated at high speed.

The maintenance cycle of the contact unit can be significantly extended as compared with the conventional mechanism because each component is thicker enough to be produced, the spring 5 is larger in diameter, optimum materials and surface treatment can be chosen and the usable volume of the contact 2 is larger.

Furthermore, the number of consumable components is substantially decreased as shown in the figure, which presents a huge advantage in cost.

Still furthermore, as far as power-supply performance is concerned, the contact's face contact and spring's strong pressing force enable impedance to be maintained at a lower value. The wear of the contact 2 will not change a contacting area, so that impedance will not be changed either while the contact is being used.

While the power supply mechanism is used for supplying RF power inside the vacuum device in the above embodiment, the mechanism may be used for supplying direct current power. Other materials and surface treatment may be used for the contact and the power supply ring in addition to the foregoing as long as they are equivalent in characteristic.

Still furthermore, while the contact 2 touches the inner side of the power supply ring 20 in the present embodiment, the contact 2 may be configured so as to touch the outer side thereof. In addition, while the contact 2 is caused to come into face contact with the power supply ring 20 in the present embodiment, even linear or point contact is capable of preventing the spring 5 from deteriorating, as long as the contact is caused to contact the side of the power supply ring 20, thereby producing no torsion applied to the contact, and the movable direction of the contact is determined as stated above.

In the above is described the embodiment for supplying electric power to the substrate dome which is rotatably arranged inside the vacuum device. The power supply mechanism according to the present invention, however, is applicable to one that supplies electric power to a rotating electrode arranged inside a vacuum device as well as the above embodiment. When voltage is applied across a rotating deposition material in a deposition method using sputtering, for example, electric power can be applied by the power supply mechanism according to the present invention with a vessel or the like loaded with deposition material taken as a rotating electrode.

The invention claimed is:

1. A vacuum device comprising: a vacuum chamber;
a rotating electrode arranged inside and electrically insulated from the vacuum chamber; and
a power supply mechanism which touches the rotating electrode to supply electric power thereto; wherein
the rotating electrode has an annular shape and horizontally rotates with respect to the center axis of the annular shape,
the power supply mechanism comprises at least one electrode member, the electrode member has a face that comes into contact with the rotating electrode by a surface that is located in the inner side of the rotating electrode, the face has a curved surface that is equal in curvature to a curved surface of the rotating electrode, and the electrode member has such a shape that a cross-section area taken in a plane equal in distance from the surface is constant.

2. A vacuum device comprising:
a vacuum chamber;
a rotating electrode arranged inside and electrically insulated from the vacuum chamber; and
a power supply mechanism which touches the rotating electrode to supply electric power thereto; wherein
the rotating electrode has a cylindrical shape and horizontally rotates with respect to the center axis of the cylindrical shape,
the power supply mechanism comprises at least one electrode member, and the electrode member and the rotating electrode come into contact with each other at a surface, and the surface is located in the inner side of the rotating electrode, and
the electrode member is movable to a first direction of a resultant force and a second direction that is opposite to the first direction, where the resultant force is determined by a normal, on the electrode member side, to the rotating electrode at the surface and a tangential, along a rotating direction, to the surface.

3. The vacuum device according to claim 2, wherein
the electrode member is supported by one fulcrum,
the fulcrum is positioned at any point on a straight line virtually perpendicular to the direction of the resultant force and passing through one point on the electrode member, and
the electrode member is movable around the fulcrum.

4. The vacuum device according to claim 1 or 2, wherein
the power supply mechanism is further provided with an electrode member base which fixes the electrode member, a unit base which supports the electrode member base, and a pin which fastens the electrode member base to the unit base, and the electrode member base and the electrode are movable using the pin as a fulcrum.

5. The vacuum device according to claim 1 or 2 further comprising at least one spring which presses the electrode member against the rotating electrode.

6. The vacuum device according to claim 5, wherein the power supply mechanism is further provided with:

a spring base which fixes the spring to the unit base;

a power supply thin plate which supplies electric power from the unit base to the electrode;

a countersunk screw which fastens the electrode member to the electrode member base with the power supply thin plate sandwiched therebetween; and a power-supply thin plate retainer which fixes the power supply thin plate to the spring base.

7. The vacuum device according to claim 1 or 2 wherein the rotating electrode consists of a rotating cylinder with a substrate dome on which a deposition substrate is mounted.

* * * * *